United States Patent [19]
Rivers et al.

[11] Patent Number: 6,078,532
[45] Date of Patent: Jun. 20, 2000

[54] METHOD AND APPARATUS FOR IMPROVING PERFORMANCE OF DRAM SUBSYSTEMS WITH SRAM OVERLAYS

[75] Inventors: James P. Rivers, Saratoga; Gregory L. DeJager, San Jose; David H. Yen, Palo Alto; Stewart Findlater, Mountain View; Bradley Erickson, Belmont; Scott A. Emery, Saratoga, all of Calif.

[73] Assignee: Cisco Technology Inc., San Jose, Calif.

[21] Appl. No.: 09/241,836

[22] Filed: Feb. 1, 1999

[51] Int. Cl.⁷ .................................................. G11C 7/00
[52] U.S. Cl. ................ 365/194; 365/230.03; 365/230.06
[58] Field of Search ............................. 365/194, 230.03, 365/230.06; 711/152, 100

[56] References Cited

U.S. PATENT DOCUMENTS

| | | | |
|---|---|---|---|
| 5,305,280 | 4/1994 | Hayano ............................... | 365/230.03 |
| 5,588,130 | 12/1996 | Fujishima et al. ....................... | 395/445 |
| 5,623,635 | 4/1997 | Chen et al. .............................. | 711/152 |
| 5,680,570 | 10/1997 | Rantala et al. .......................... | 395/440 |
| 5,748,633 | 5/1998 | Lawler et al. ........................... | 370/401 |
| 5,787,255 | 7/1998 | Parlan et al. ........................ | 395/200.63 |
| 5,841,580 | 11/1998 | Farmwald et al. ...................... | 365/194 |
| 5,991,851 | 11/1998 | Alwais et al. ...................... | 711/100 X |

*Primary Examiner*—Huan Hoang
*Attorney, Agent, or Firm*—Sheridan Ross P.C.

[57] ABSTRACT

A memory system reducing or eliminating the effects of DRAM page-opening delays or row access delays is provided. The system uses DRAM and fast memory such as SRAM. SRAM is used to store the initial portions of data from data blocks and corresponding portions of DRAM are used to store the terminal portions of data from the data blocks. When access to a block of data is requested, DRAM row access procedures are initiated. During the delay period, while DRAM row access procedures are occurring, the initial portion of data from the requested block is read-out from SRAM. By about the time the initial data read-out from SRAM is completed, DRAM row access procedures are completed and the remaining portion of the data is read-out from DRAM.

14 Claims, 4 Drawing Sheets

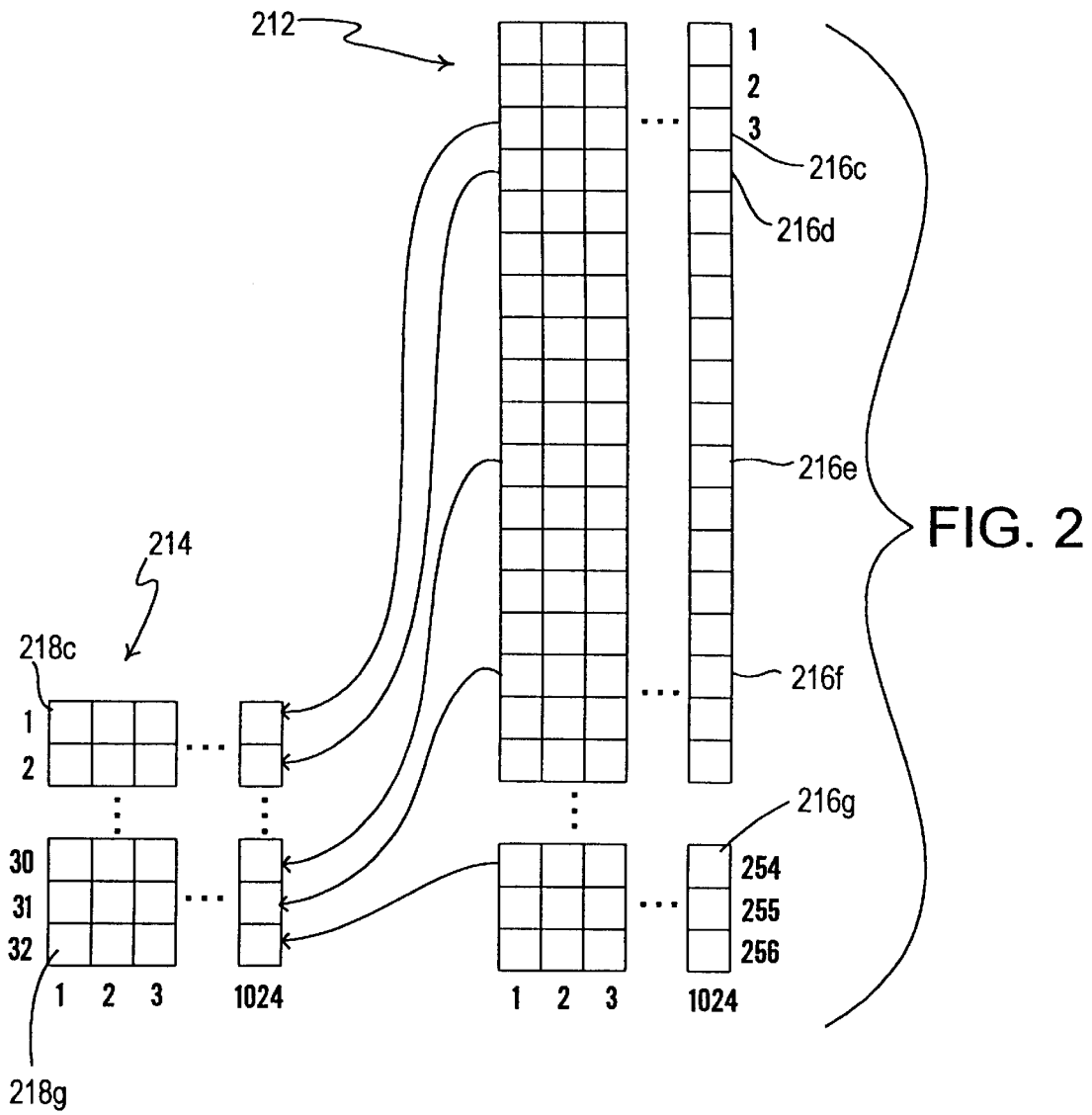

METHOD AND APPARATUS FOR IMPROVING PERFORMANCE OF DRAM SUBSYSTEMS WITH SRAM OVERLAYS

The present invention relates to reducing the impact, on memory performance, of DRAM page-opening delays and in particular a method and apparatus using SRAM or other fast memory during the DRAM page-opening delay.

BACKGROUND INFORMATION

Among the characteristics of a memory system or subsystem which is often of importance is what may be termed "memory performance" including, in this context, a measure of how long it takes to obtain from memory, a desired portion of the data stored therein. The appropriate metric for assessing such performance can depend on, or be affected by, certain characteristics of the data of a typical data request. For this reason, a memory system or subsystem which might be appropriate for some uses (e.g. as general purpose memory in a personal computer) may be less optimal for another purpose (such as frame storage in a network switch). Often a memory designed for a particular purpose represents a balance among numerous factors in addition to performance, such as component costs, flexibility of use, complexity of design, time to market and similar factors. Many previous memory systems or subsystems designs have involved selection of dynamic random access memories (DRAM), static random access memories (SRAM) or a combination of the two. While DRAM is typically a relatively less expensive option, it generally provides slower access and poorer performance than the (relatively more expensive) SRAM or "fast" memories. In typical previous uncached DRAM systems, all portions of data in a given data request were read directly from the DRAM. Many DRAMs are configured to reduce the access time and/or performance disadvantages, such as by using fast page mode or other data access techniques. Even with such techniques, however, there are access time and/or performance disadvantages to DRAM, compared to, e.g., SRAM. One such disadvantage arises, at least in part, from the period of time required to access or open a row (or "page") of DRAM memory. Thus, when DRAM receives an instruction to provide memory from a "new" row, there will typically be a delay ("page-opening" delay or "row access" delay) before memory words in that row are output from the memory. Typically, once such delay is past, access to each successive word in row ("access cycle" times) is relatively rapid (and on the order of the performance found in many SRAMs). By way of example, a typical DRAM may have a page opening delay equal to about five access cycles, i.e. about equal to the time required to output five data words (or access five successive columns) once the page-opening delay has past.

Although the page-opening delay represents, in general, a disadvantage of DRAM, if a typical data request accesses, e.g. all or a substantial portion of a row (which may have, for example, 1024 8-bit words or more) the five access cycle delay represents a relatively small portion of the typical data request. However, in applications where the typical data request is much smaller, a relatively greater portion of all data access operations will be devoted to the page access delays. For example, of each accesses for a 1024 word row, only about 0.5% (5/1024) of each access is used for "unproductive" row access delays. However, if the average access is for, e.g., 100 words, over a period of time, about 5% of total memory access time is devoted to "unproductive" page access delays. Thus, a memory or a memory subsystem design which may be suitable for one purpose may result in significant performance penalties when applied to a different use. Accordingly, it would be useful to provide a memory system or memory subsystem which can reduce the effect of DRAM page access delays, particularly when average data accesses are substantially less than a row.

One previous approach to improving overall memory system or subsystem performance has been data caching. In data caching, selected portions of the data stored in the (slower) DRAM are duplicated in a smaller, but faster SRAM cache. In typical previous DRAM/SRAM "cache" systems, each data access directly obtained data only from the cache. Typically, in such systems, if the requested data did not reside in the cache, the row of DRAM containing the desired data was loaded into the cache (over-writing, e.g., the least—recently—used row of SRAM) and then the desired data was obtained from the cache. Thus, in many previous DRAM/SRAM systems, all data for a given request was read (directly) from the SRAM cache. Such a system is useful when there is a way of predicting which of the data in the DRAM is likely to be used in the future (so that this data can be loaded into the SRAM "ahead of time"). Such predictions are often based on data-co-location, i.e. a finding that, in many systems, access of certain data is followed by requests for data which is relatively closely—located, often successive data. Many cache systems routinely duplicate, in SRAM, entire rows or "pages" of DRAM, since the request for data in a given row of DRAM is very often followed by request for other data in the same row.

Although SRAM caching can be useful in improving performance in situations where such "co-location" of data is common, its benefits are diminished (or eliminated) when the degree of co-location is relatively low (or when successive data requests are for locations which are relatively more random). Furthermore, data caches typically involve certain overhead costs including the cost of assuring data coherency, i.e. assuring that the data in a cache accurately duplicates the most recent or valid data in the DRAM (e.g. in light of memory write operations that may have been performed). Accordingly, it would be useful to provide for improvements in memory or memory subsystem performance which are effective even when there is little or no data co-location and in which the overhead involved in maintaining coherency is reduced or eliminated.

One example of a device in which previous or standard memory systems or subsystems have relatively lower performance is a network switch. Typically a network switches must store and access a plurality of "frames". A frame may have, e.g., between 512 and 12,144 bits and will typically be substantially less than a DRAM row in length. Also, it is common to request frames from memory in a relatively random order, such that co-location of data is substantially low (as compared to many other uses of memory systems such as main memory of a typical personal computer). Accordingly, it would be useful to provide a memory system or a memory subsystem which provides relatively high performance when used in a network switch.

SUMMARY OF THE INVENTION

The present invention provides a memory system or subsystem which includes both a row-access-delay memory component (e.g. a DRAM) and a SRAM or other fast data storage element (such as register files, flip-flops or latches). As noted above, in previous systems, if a multi-word data request is issued, all words requested in the data request are read from the DRAM or, and in a typical cache system, all words in the data request are read from the SRAM cache. According to the present invention, for at least some multi-word data requests, some of the words are read from SRAM and the remaining words in the data request are read directly from DRAM. In particular, in one embodiment, when a block of data is obtained from the memory system or subsystem, the first few words in the block are obtained from SRAM, during the time that the DRAM is performing its page-opening (or "row access") procedures and, thereafter, the remaining words in the block are obtained directly from the DRAM (at a speed substantially equal to typical SRAM speeds, as noted above). For example, if the DRAM page-opening delay is equal to about five access cycles, the system can be configured to provide the first five words in a block of requested data from SRAM. By the time five words are read out of SRAM, the DRAM page-opening procedure is complete and the remaining words in the requested block can be read directly from DRAM. In this way, although the page-opening delay of DRAM still exists, this delay period is no longer "unproductive" since it is used for obtaining data, in the initial part of the requested data block, from SRAM.

This improvement in performance is particularly significant in uses where average data accesses are substantially less than the length of a DRAM row. Since the SRAM is used to store only a few words for each of a plurality of potential data block to be accessed, it is feasible, and relatively cost effective, to provide a SRAM large enough to store the beginning words from all or substantially all potential data blocks that may be requested. In this way, there is little or no need to provide a procedure for determining which portions of the data to store in SRAM. Therefore, it is of little or no importance whether there is substantial co-location of the data requests.

Because there is no need for duplication of data between the SRAM and DRAM (although SRAM could be used for providing some duplication, if desired) the system can be configured such that there is no need to maintain coherency, i.e. if there is a data write, the new data is sent to SRAM only if it is within the (predefined) first few words of a data block and otherwise is written to DRAM.

In one embodiment of the invention, a network switch is provided with a DRAM/SRAM memory subsystem providing for relatively high performance even when used for storing relatively small frames and even when accessing such frames in substantially random fashion.

BRIEF DESCRIPTION OF THE DRAWINGS

FIG. 2 is a schematic diagram showing an example of a relationship between a DRAM memory and a SRAM cache;

DETAILED DESCRIPTION OF THE PREFERRED EMBODIMENTS

Figure 1:
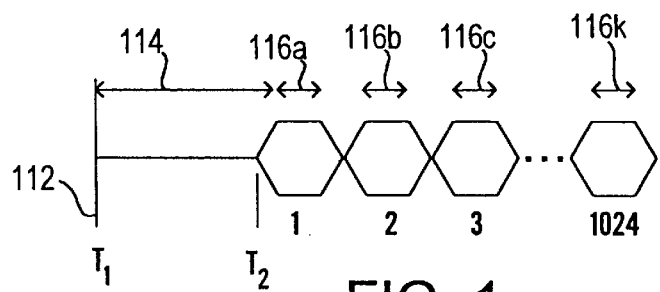
FIG. 1. is a timing diagram depicting certain aspects of timing in a row access of DRAM memory.

Before describing embodiments of the present invention, certain features of previous systems will be described. In at least some previous DRAM systems, after a data request is made, DRAM data access begins, e.g. at time $T_1$ 112, performing a row access or page-opening procedure which extends for a first time period 114 until time $T_2$. At that time, a plurality of word access (or column access) cycles is performed, each occupying an "access cycle" period of time 116a through 116k. In the illustration of FIG. 1, k is equal to 1024, a typical DRAM row length. As can be seen from FIG. 1, if the total number of words obtained as a result of the data access is k, then the total amount of time needed to access the requested data is $D+(K \times A)$ where D is the page-opening delay 114, K is the number of words read-out in response to the access request and A is the access cycle length 116 for each word. One measure of performance system is the ratio of the number of words read-out in a data access to the amount of time consumed by the access, i.e. $K/(D+(K \times A))$. For relatively large values of K, performance approaches $1/A$. However, for smaller values of K, the relative contribution of D to the denominator is larger and performance is relatively less.

Figure 3:
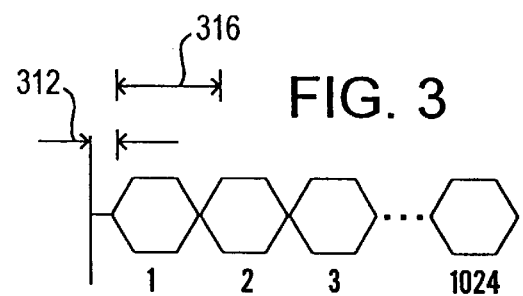
FIG. 3 is a timing diagram showing certain aspects of the timing of an SRAM memory access.

One previous approach to improving performance is depicted in a cache system as illustrated in FIG. 2 which includes both a DRAM 212 and an SRAM 214. Typically the DRAM is relatively large (256 rows and 1024 columns in the illustration of FIG. 2) and the SRAM 214 relatively smaller. The illustration of FIG. 2 shows 32 rows and 1024 columns although a typical CPU "level one" cache might have, e.g., 1024 rows of 128 columns (with a cache line being composed of a portion of a DRAM row). In the system of FIG. 2, data from selected rows 216c, d, e, f, g of the DRAM 212 are duplicated or copied in rows 218c through 218g of the SRAM 214. When data is accessed, it is read from a row of SRAM 214. As depicted in FIG. 3, when data is accessed from SRAM, the delay 312, if any, before initiation of the first access cycle 316 is very small, compared to the delay 114 for a DRAM.

As depicted in FIG. 2, in a typical system, each row 218 of SRAM 214 duplicates an entire row of DRAM 212. This scheme, besides involving the data co-location and coherency issues noted above, also means that, although the entire memory system of FIG. 2 has a total of 288 rows of memory (DRAM rows, plus SRAM rows), its effective capacity is only 256 rows of memory (since 32 rows are duplicates of another).

Figure 4:
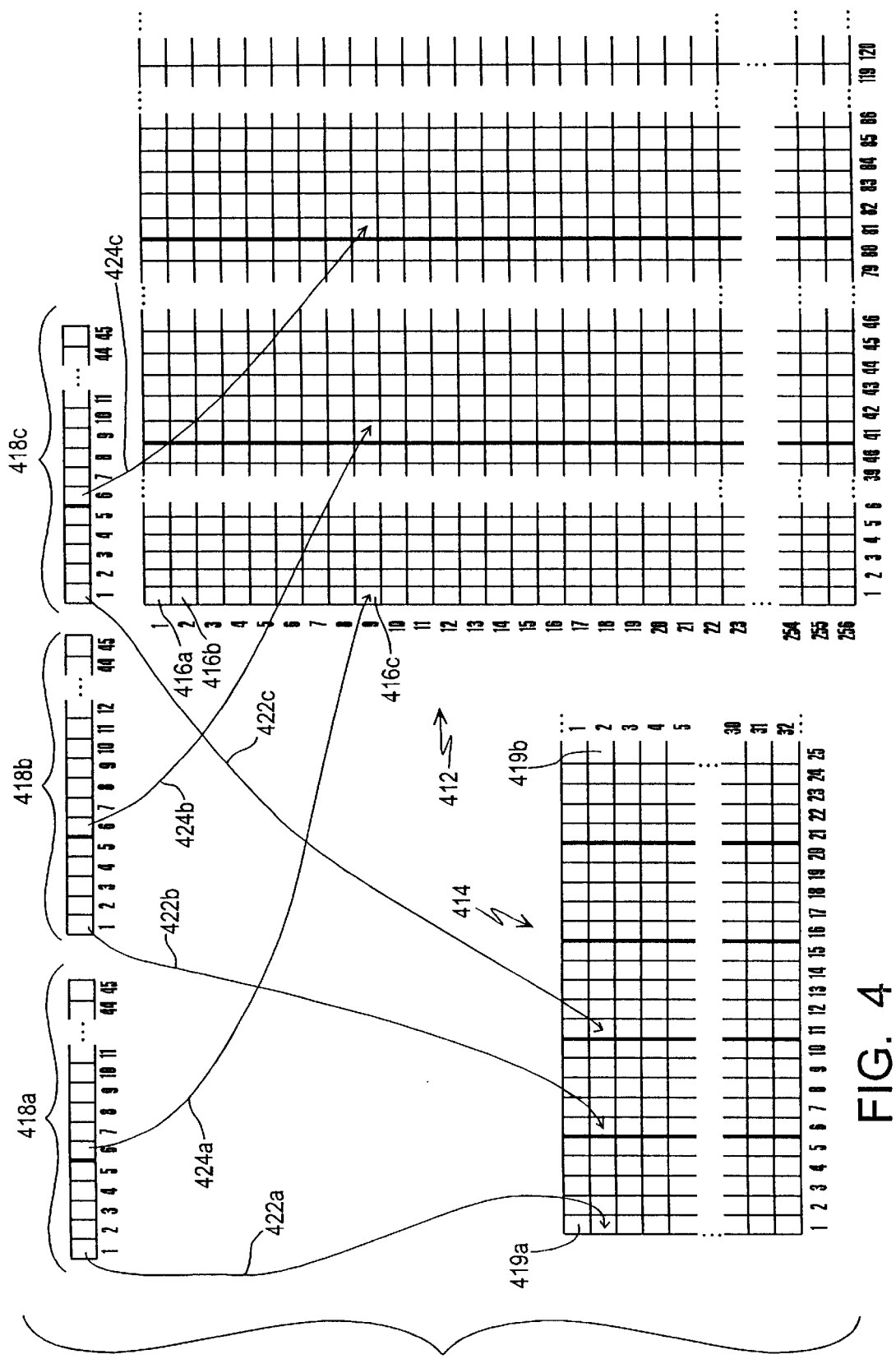
FIG. 4 is a diagram illustrating storage of data in DRAM and SRAM according to an embodiment of the present invention.

FIG. 4, provides a simplified example illustrating the construction and use of a memory subsystem according to an embodiment of the present invention. In the illustration of FIG. 4, each small square represents one word. In the simplified illustration of FIG. 4, all, or substantially all, data access requests are for data blocks 418a, b, c with a length less than or equal to 45 words. For purposes of illustration, the DRAM 412 has 256 rows and 1,000 columns and the SRAM 214 has 32 rows and 1,000 columns. As will be clear to those of skill in the art, other sizes and dimensions of DRAMs and SRAMs can be used in implementing the present invention. FIG. 4 illustrates a manner in which the 45 words from each of three data blocks can be stored in the DRAM 412 and SRAM 414. In this illustration, the row access delay of the DRAM 412 is sufficiently long to accommodate reading-out of five successive words from the SRAM 414. For this reason, for each of the three illustrated 45-word blocks 418a, 418b, 418c, the first five words of the block will be stored 422a, b, c in SRAM 414 and the remaining 40-words of the block will be stored 424a, b, c in DRAM 412. Preferably there is a predefined relationship between each of a plurality of predefined 40-word blocks of the DRAM 412 and one of a plurality of five-block words of the SRAM 414, with relationship being such that the address code contained in an access request may be decoded to obtain both the beginning SRAM address for the first five words of the requested block and the beginning DRAM address for the remaining 40 words of the desired block.

In the simplified illustration of FIG. 4, each 1,000-word row of DRAM can be considered as composed of 25 40-word blocks and each 1,000 row of SRAM can be considered as of consisting of 200 5-word blocks. In one relationship scheme, the first 25 40-word blocks residing in the first row 416a of DRAM correspond respectively to the first 25 5-word blocks (i.e. the first 125 words) of the first row 419a of SRAM 214 (Although row and column addresses and memory systems typically are numbered beginning with zero, ordinal numbering is used in the illustration of FIG. 4 for clarity). The next succeeding 25 blocks of DRAM (i.e. the 25 40-word blocks in the second row 416b of the DRAM 412) correspond respectively to the next succeeding 25 5-word blocks of SRAM i.e. occupying words 126–250 of the first row 419a of SRAM 214, and so forth. In this context, a block of SRAM and a block of DRAM "correspond" to one another if they contain, respectively, the first 5 words and last 40 words from a single 45 word block of data. Although a number of different ways of relating access request addresses, DRAM blocks and SRAM blocks can be devised, as will be clear to those of skill in the art after understanding the present disclosure, in the illustrated example, the following relationships can be used to obtain the SRAM block row and column from a DRAM block initial row and column.

$$SRAM\ \text{ROW} = 1 + \text{INT}\left[\frac{(R-1)\cdot 10 + C}{200}\right] \quad (A)$$

$$SRAM\ \text{Column} = \lfloor (R-1)\cdot 10 + C \rfloor\ \text{MOD}\ 200 \quad (B)$$

Those of skill in the art will understand how to calculate a block DRAM starting address based on a normal access request addresses and how to devise DRAM block address and SRAM block address formulas for other block relationship schemes, after understanding the present disclosure. Those of skilled in the art will also understand, after understanding the present disclosure, how to use hardware devices such as instruction and/or address decoders, to provide addresses to DRAM and SRAM, in response to an address request.

As one illustration, if blocks 418a, b, c are to be stored in successive locations with the first block 418a being placed in the 201st successive block location of the system, the first five words of block 418 would be stored 422a in the first 5 words of the second row 419b of SRAM 414 and the remaining 40 words of block 418a would be stored in 424a in the first 40-word block of the 9th row 416i of DRAM 412. Similarly, the first five words of block 418b would be stored 422b in the second 5-word block of the second row 419b, the last 40 words of block 418b, would be stored 424b in the second 40-word block of the 9th row 416i of DRAM 412, the first 5 words of block 418c would be stored 422c in the third 5-word block of the second row 419b of SRAM 414 and the last 40 words of block 418c would be stored 424c in the third 40-word block of the 9th row 416i of DRAM 412.

With the data of each block 418a, b, c split, in this fashion, between DRAM 412 and SRAM 414, it is possible to read the initial 5-word portion of a given data block out of SRAM during the time that row access procedures are being performed in DRAM 412 such that, by the time the first 5 words of a block have been obtained from SRAM 414, DRAM 412 is ready to begin outputting the next 40 words of the block, to, accordingly, achieve the output of all 45 words of the block in a time period substantially equal to 45 times the access cycle time.

Figure 5:
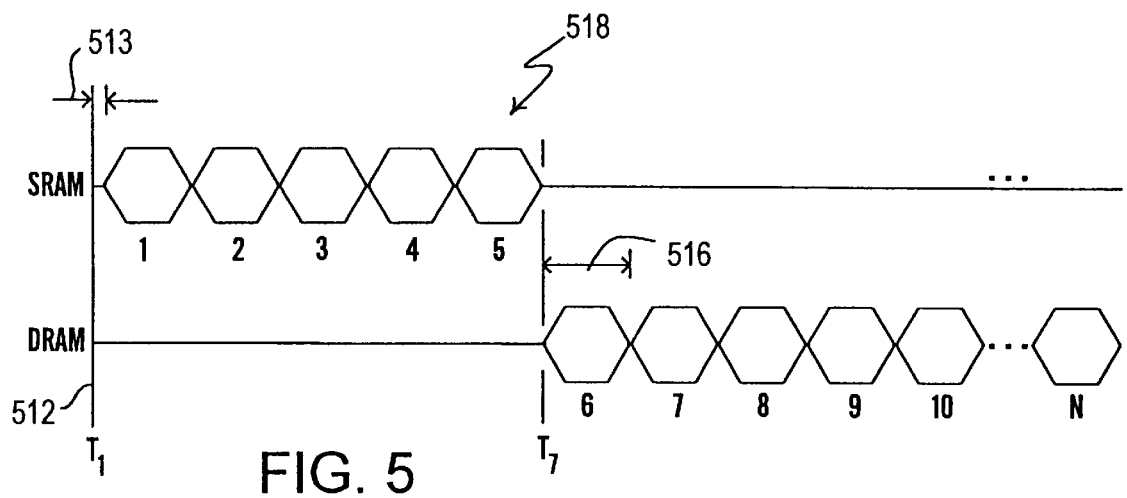
FIG. 5 is a timing diagram illustrating certain aspects of the timing of data access according to an embodiment of the present invention.

Thus, as illustrated in FIG. 5, following initiation of an access at time $T_1$ 512, there is little (if any) delay 513 before output of the first 5 words of the requested data from SRAM 518. By the time $T_7$ the SRAM block has been read-out, DRAM row access procedures have been completed and DRAM can begin reading-out words, beginning with, in this illustration, the sixth word of the requested data block, at the normal DRAM access cycle rate 516.

Figure 6:
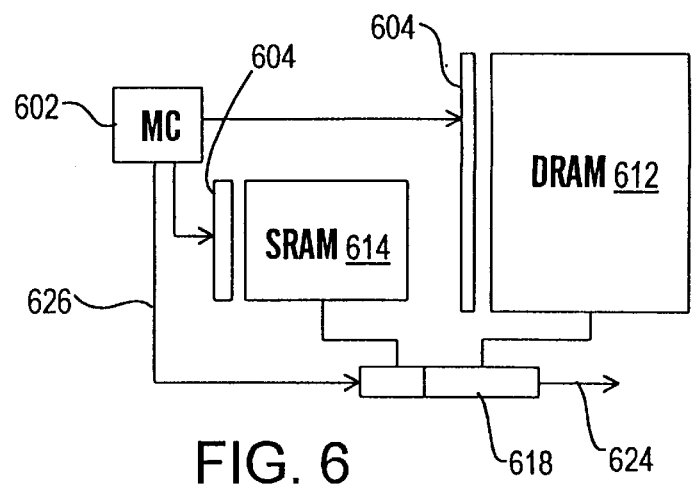
FIG. 6 is a block diagram depicting components of a memory subsystem used during access of memory according to a embodiment of the present invention.
Figure 7:
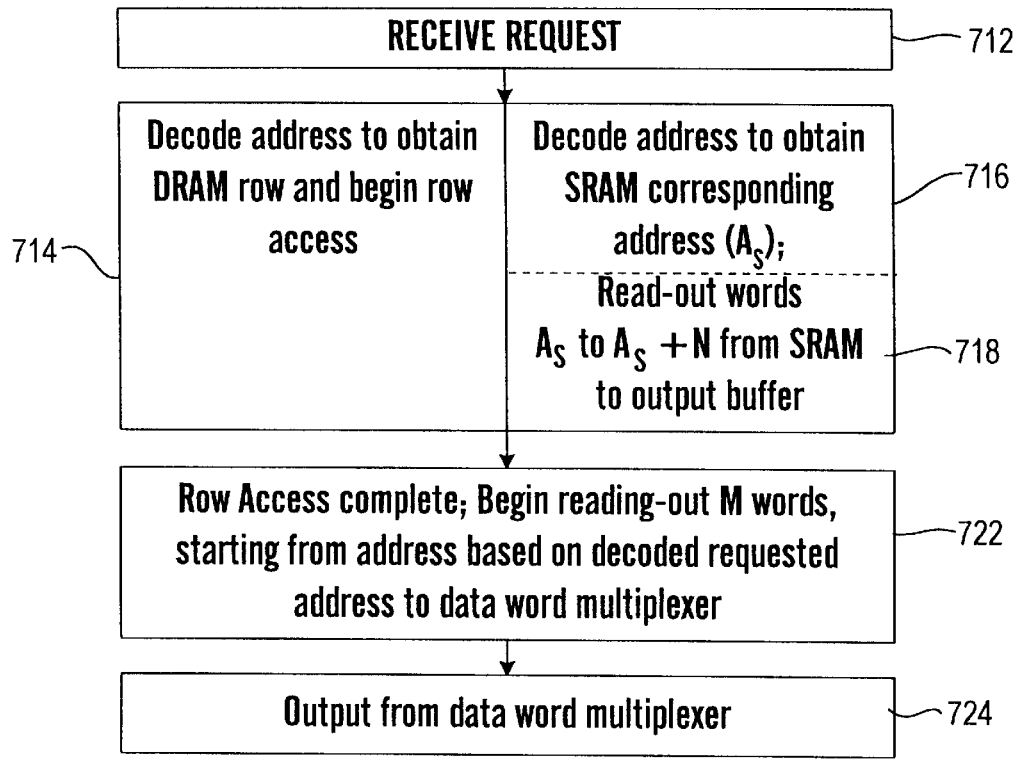
FIG. 7 is a flow chart depicting a memory access according to an embodiment of the present invention.

In the illustration of FIGS. 6 and 7, a memory controller 602 receives a memory request 712 (FIG. 7) containing an address for the beginning of a block. The memory controller 602 provides the address, or portions thereof, to a DRAM address decoder 604 for decoding the address to obtain the DRAM row address which contains the terminal portion of the requested data block and row access procedures are begun 714. Substantially simultaneously, the memory controller 602 also provides the address (or portions thereof) to the SRAM address decoder 606 for decoding 716 the address to obtain the SRAM address $A_s$ of the SRAM block which contains the initial portion of the requested data block and, based on this address, a predefined number N of words is read-out 718 from SRAM to the initial portion of a data word multiplexer 618. By the time the N words have been read-out from SRAM, 614, row address for the DRAM 612 is complete and the DRAM begins reading out 722 M words, starting from the address based on the decoded 714 requested address, to the terminal portion of the data word multiplexer 618. The complete data block requested is, in this manner, placed into the data word multiplexer 618 and then can be output 724 on output line 624 e.g. under control 626 of the memory controller 602.

Figure 8:
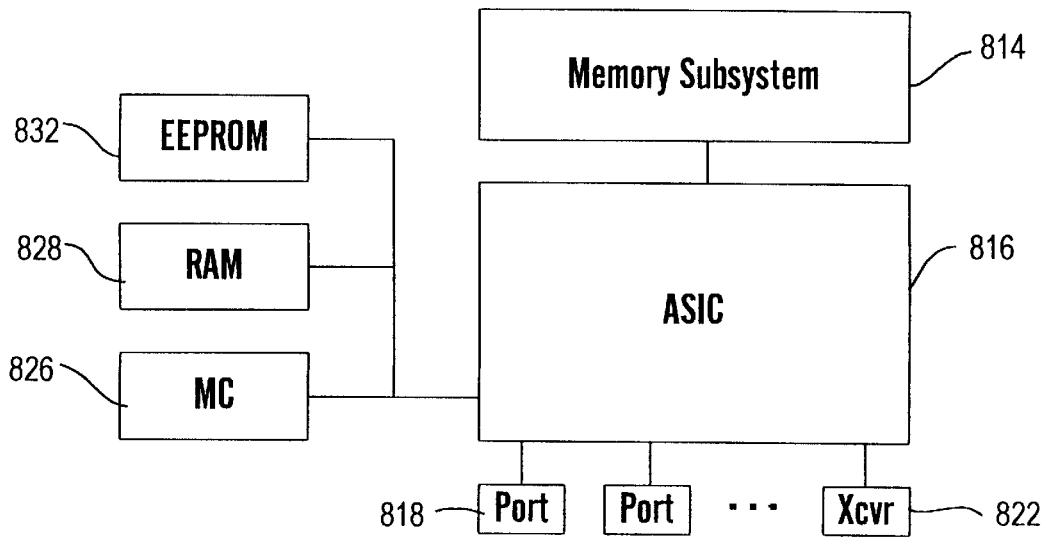
FIG. 8 is a block diagram of a network switch of a type which can incorporate a memory subsystem with increased performance, according to an embodiment of the present invention.

FIG. 8 illustrates, in block diagram form, a network switch 812 in which a DRAM/SRAM memory subsystem 814 as described above, can be used e.g. for storing frames. The memory subsystem 814 is coupled to an application specific integrated circuit (ASIC) 816. The ASIC 816 would typically contain media access controllers for each of a plurality of ports such as 10/100 Ethernet ports 818, and/or transceivers 822, buffer allocation and management, for allocating and managing the storage supplied by the memory subsystem 814, routing tables, forwarding logic, queuing logic and intermediate buffering as may be desired for using the memory subsystem 814. Supervisory functions are performed by a microcontroller 826 using instructions stored in RAM 828 and/or non-volatile program storage such as flash EEPROM (electrically erasable programmable read only memory) 832 subsystems.

In light of the above description, a number of advantages of the present invention can be seen. The present invention can reduce or eliminate the detrimental effects of DRAM page-opening delays, being especially useful when accesses are made to blocks substantially smaller than a row length. The present invention provides and uses both DRAM and SRAM, utilizing the best features of each, without the need to address issues of coherency and data co-location of the type typically arising in DRAM/SRAM cache systems. The present invention can be used without the need for duplicating data, such that it is possible to utilize the full memory capacity of the combined DRAM and SRAM capacities. The present invention provides a system which can obtain data from both and SRAM and DRAM in response to a single data access request.

A number of variations and modifications of the invention can be used. It is possible to use some features of the invention without using others. For example, its possible to construct a system which reduces the effects of DRAM page access delay without eliminating data duplication between DRAM and SRAM. Although embodiments of the invention have been described in which performance is improved by reducing or eliminating the disadvantages of page-opening delays in DRAM, it is possible to use features of the present invention in combination with other memory system configurations, such as using features of the present invention in combination with fast page mode DRAM access, in combination with SRAM or other cache systems (such as providing a separate SRAM for caching, or using one portion of a SRAM as described above and another portion of the SRAM for traditional caching) and the like. The present invention can be provided with SRAM and DRAM on separate chips, connected e.g. by a bus, can be provided with SRAM and DRAM formed on a single chip, and/or with the described memory system or subsystem formed on a chip along with other components (e.g. a system on a chip). Although the present invention is particularly advantageous when average accesses are substantially less than a row, the present invention can also be used in contexts where average access lengths approach (or exceed) DRAM rows. Although the present invention can be implemented without the need for duplicating data between the DRAM and the SRAM, a system that provides for some duplication would also be operable. Although embodiments of the present invention have been described in which all potential data blocks to be provided in response to an access request are substantially the same size, it is also possible to provide a system in which two or more different data block sizes are provided (e.g. in different locations of memory) such as may be useful in systems where the distribution of data block sizes is bi-modal or multi-modal. Although embodiments of the present invention have been described in which the entire memory system is configured so the data is distributed between SRAM and DRAM in a block-wise fashion, it is possible to provide a portion of memory which is configured and/or accessed in other fashions, such as traditional DRAM and/or SRAM memory. Although illustrations of particular block sizes have been provided, as will be clear to those of skill in the art, the present invention can be provided using a number of different block sizes to accommodate different anticipated maximum sizes of blocks of data requested in a given data access request and/or to accommodate different lengths of DRAM page-opening delays and/or SRAM access cycle times. Although an embodiment was illustrated in which all the data blocks had a given length, the system can be implemented in the context of a situations where data requests may be for blocks of varying length. In one embodiment, a data block length is selected which equals the maximum normally-expected data block length. In this embodiment, data blocks which are shorter than this length are stored e.g. in the initial portion of the predefined-length blocks and the remaining portion of the block may remain unused (or may be used for other purposes). Thus, the average length of requested data and variability in the length of requested data, compared to the predefined block length will determine what portion of the memory may remain unused, on average. Although the present disclosure includes illustrations in which the SRAM blocks had a length such that the time required to read the SRAM block from SRAM was equal to the DRAM page access delay, the present invention can be implemented with shorter or longer SRAM blocks.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and\or reducing cost of implementation.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangable and/or equivalent structures, functions, ranges or steps to those claimed, whether or not such alternate, interchangable and/or equivalent structures, functions, ranges or steps are disclosed herein, and without intending to publicly dedicate any patentable subject matter.

What is claimed is:

1. Apparatus for reducing effects of DRAM row access delays comprising:

DRAM having a row access delay;

a fast memory;

read/write control circuitry, coupled to said DRAM and to said fast memory, which, in response to a read request for a block of memory, controls said fast memory to output at least a first plurality of data words within said block of memory and controls said DRAM to output at least a second plurality of data words, different from said first plurality of data words, within said block of memory;

wherein said control circuitry controls said DRAM to begin row access procedures during at least a portion of a period when said first plurality of words is output from said fast memory.

2. Apparatus, as claimed in claim 1 wherein said fast memory comprises SRAM.

3. Apparatus, as claimed in claim 2, wherein said DRAM comprises a plurality of predefined DRAM blocks, each DRAM block being large enough to store at least a number of words equal to the number of words in said second plurality of data words, and wherein, for each said DRAM block, there is a predefined SRAM block in said SRAM, each of said predefined SRAM blocks being large enough to store at least a number of words equal to the number of words in said first plurality of data words.

4. Apparatus for reducing effects of DRAM row access delays comprising:

DRAM having a row access delay;

a fast memory;

read/write control circuitry, coupled to said DRAM and to said fast memory, which, in response to a write request for writing a block of memory, writes at least a first plurality of data words within said block of memory to said fast memory and writes at least a second plurality of data words, including words different from said first plurality of data words, within said block of memory to said DRAM;

wherein said read/write control circuitry controls said DRAM to begin row access procedures during at least a portion of a period when said first plurality of words is written to said fast memory.

5. Apparatus, as claimed in claim 4, wherein said first plurality of data words is written to one of a plurality of predefined portions of said fast memory, each of said plurality of predefined portions of fast memory having a length at least sufficient to store said first plurality of data words.

6. Apparatus, as claimed in claim 4 wherein said second plurality of data words is written to one of a plurality of predefined portions of said DRAM, each of said plurality of predefined portions of DRAM having a length at least sufficient to store said second plurality of data words.

7. Apparatus, as claimed in claim 6 wherein said DRAM includes a second plurality of predefined portions of said DRAM, each of said second plurality of predefined portions of DRAM containing a number of data words different from the number of data words in said second plurality of data words.

8. A method for reducing effects of DRAM row access delay comprising:

receiving a data read request for a block of data;

initiating DRAM row access procedures for a row of a DRAM in which at least a portion of said block of data is stored;

outputting, from a fast memory, different from said DRAM, a portion of said block of data; and outputting, from said DRAM, remaining portions of said block of data;

wherein at least some of said outputting from said fast memory is performed during a time when said row access procedures are being performed in said DRAM.

9. A method as claimed in claim 8 wherein said outputting from said fast memory occurs over a period of time not substantially greater than said DRAM row access delay.

10. A method, as claimed in claim 8 wherein said step of initiating is performed substantially simultaneously with said step of outputting from a fast memory.

11. A method, as claimed in claim 8 wherein said data read request includes an address and further comprising decoding said address to provide a fast memory address and a DRAM address, different from said fast memory address.

12. Apparatus for reducing effects of DRAM row access delay comprising:

DRAM and SRAM;

control circuitry means, coupled to said DRAM and said SRAM, for, in response to receipt of a read request for a block of data, initiating row access procedures in said DRAM and outputting, from said SRAM, a first plurality of words in said block of data; and said control circuitry means further for outputting, from said DRAM, a second plurality of words, different from said first plurality of words;

wherein said control circuitry means initiates said row access procedures substantially simultaneously with initiating output of said first plurality of words from said SRAM.

13. Apparatus, as claimed in claim 12, wherein said control circuitry means outputs said second plurality of words following the outputting, from said SRAM, of said first plurality of words.

14. A network switch comprising:

a plurality of ports;

a plurality of media access controllers;

forwarding and queuing logic circuitry;

a microcontroller;

a memory subsystem which includes
DRAM;
SRAM;
control circuitry means, coupled to said DRAM and said SRAM, for, in response to receipt of a read request for a data frame, initiating row access procedures in said DRAM and outputting, from said SRAM, a first plurality of words in said data frame, wherein said control circuitry means initiates said row access procedures substantially simultaneously with initiating output of said first plurality of words from said SRAM; and said control circuitry means further for outputting, from said DRAM, a second plurality of words, different from said first plurality of words, following the outputting, from said SRAM, of said first plurality of words.

* * * * *